(12) United States Patent
Abadeer et al.

(10) Patent No.: US 7,301,210 B2
(45) Date of Patent: Nov. 27, 2007

(54) METHOD AND STRUCTURE TO PROCESS THICK AND THIN FINS AND VARIABLE FIN TO FIN SPACING

(75) Inventors: Wagdi W. Abadeer, Jericho, VT (US); Jeffrey S. Brown, Middlesex, VT (US); Kiran V. Chatty, Williston, VT (US); Robert J. Gauthier, Jr., Hinesburg, VT (US); Jed H. Rankin, South Burlington, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 11/306,827

(22) Filed: Jan. 12, 2006

(65) Prior Publication Data

US 2007/0170521 A1    Jul. 26, 2007

(51) Int. Cl.
H01L 29/76    (2006.01)
H01L 29/94    (2006.01)
H01L 31/062   (2006.01)
H01L 31/113   (2006.01)
H01L 31/119   (2006.01)

(52) U.S. Cl. ............ 257/401; 257/328; 257/331
(58) Field of Classification Search ........ 257/328, 257/331, 401
See application file for complete search history.

(56) References Cited

U.S. PATENT DOCUMENTS

| | | | |
|---|---|---|---|
| 4,650,744 A | 3/1987 | Amano | 430/313 |
| 6,812,119 B1 | 11/2004 | Ahmed et al. | 438/585 |
| 6,987,289 B2* | 1/2006 | Nowak | 257/154 |
| 7,037,790 B2* | 5/2006 | Chang et al. | 438/275 |
| 7,208,815 B2* | 4/2007 | Chen et al. | 257/627 |
| 7,214,991 B2* | 5/2007 | Yeo et al. | 257/401 |
| 2003/0121145 A1 | 7/2003 | Reinberg | 29/831 |
| 2004/0183161 A1 | 9/2004 | Reinberg | 257/623 |
| 2004/0198063 A1 | 10/2004 | Subramanian et al. | 438/712 |
| 2005/0001273 A1 | 1/2005 | Bryant et al. | 257/369 |
| 2005/0017240 A1* | 1/2005 | Fazan | 257/59 |
| 2005/0040444 A1* | 2/2005 | Cohen | 257/288 |
| 2005/0056888 A1* | 3/2005 | Youn et al. | 257/331 |

(Continued)

FOREIGN PATENT DOCUMENTS

JP    64-57729    3/1989

*Primary Examiner*—Ida M. Soward
(74) *Attorney, Agent, or Firm*—Gibb & Rahman, LLC; William D. Sabo, Esq.

(57) ABSTRACT

Disclosed is an integrated circuit with multiple semiconductor fins having different widths and variable spacing on the same substrate. The method of forming the circuit incorporates a sidewall image transfer process using different types of mandrels. Fin thickness and fin-to-fin spacing are controlled by an oxidation process used to form oxide sidewalls on the mandrels, and more particularly, by the processing time and the use of intrinsic, oxidation-enhancing and/or oxidation-inhibiting mandrels. Fin thickness is also controlled by using sidewalls spacers combined with or instead of the oxide sidewalls. Specifically, images of the oxide sidewalls alone, images of sidewall spacers alone, and/or combined images of sidewall spacers and oxide sidewalls are transferred into a semiconductor layer to form the fins. The fins with different thicknesses and variable spacing can be used to form a single multiple-fin FET or, alternatively, various single-fin and/or multiple-fin FETs.

8 Claims, 10 Drawing Sheets

U.S. PATENT DOCUMENTS

| | | | |
|---|---|---|---|
| 2005/0161739 A1 | 7/2005 | Anderson et al. | 257/347 |
| 2005/0167750 A1 | 8/2005 | Yang et al. | 257/347 |
| 2005/0205932 A1* | 9/2005 | Cohen | 257/347 |
| 2005/0213373 A1* | 9/2005 | Eldridge et al. | 365/154 |
| 2005/0242406 A1* | 11/2005 | Hareland et al. | 257/401 |
| 2005/0263801 A1* | 12/2005 | Park et al. | 257/288 |
| 2006/0054978 A1* | 3/2006 | Clark et al. | 257/401 |
| 2006/0267111 A1* | 11/2006 | Anderson et al. | 257/401 |
| 2007/0054422 A1* | 3/2007 | Lerner | 438/14 |
| 2007/0069293 A1* | 3/2007 | Kavalieros et al. | 257/350 |
| 2007/0080409 A1* | 4/2007 | Seliskar | 257/401 |
| 2007/0108528 A1* | 5/2007 | Anderson et al. | 257/365 |
| 2007/0158722 A1* | 7/2007 | Forbes | 257/296 |

\* cited by examiner

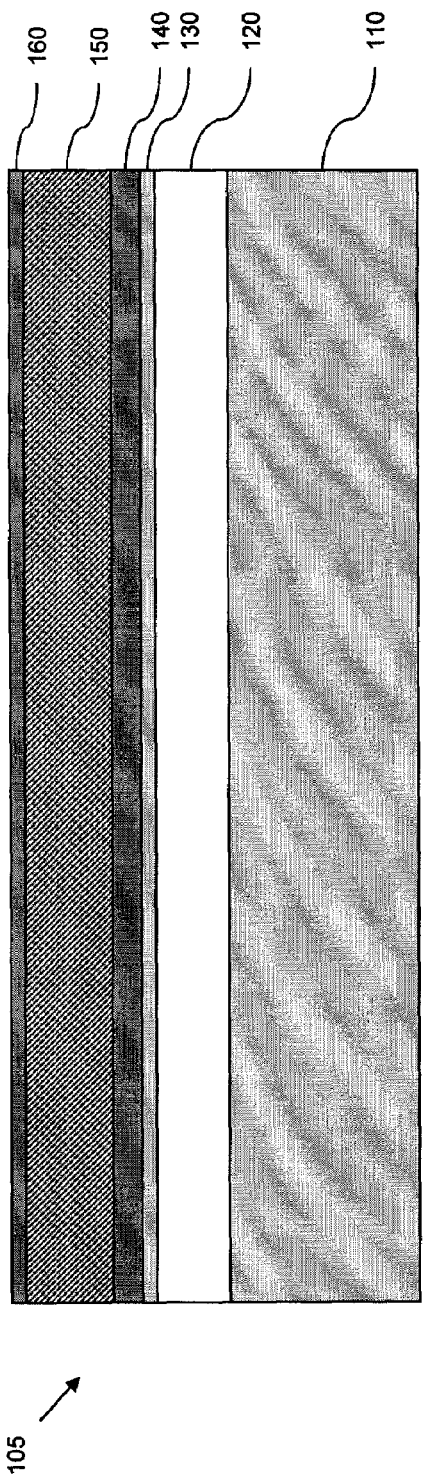
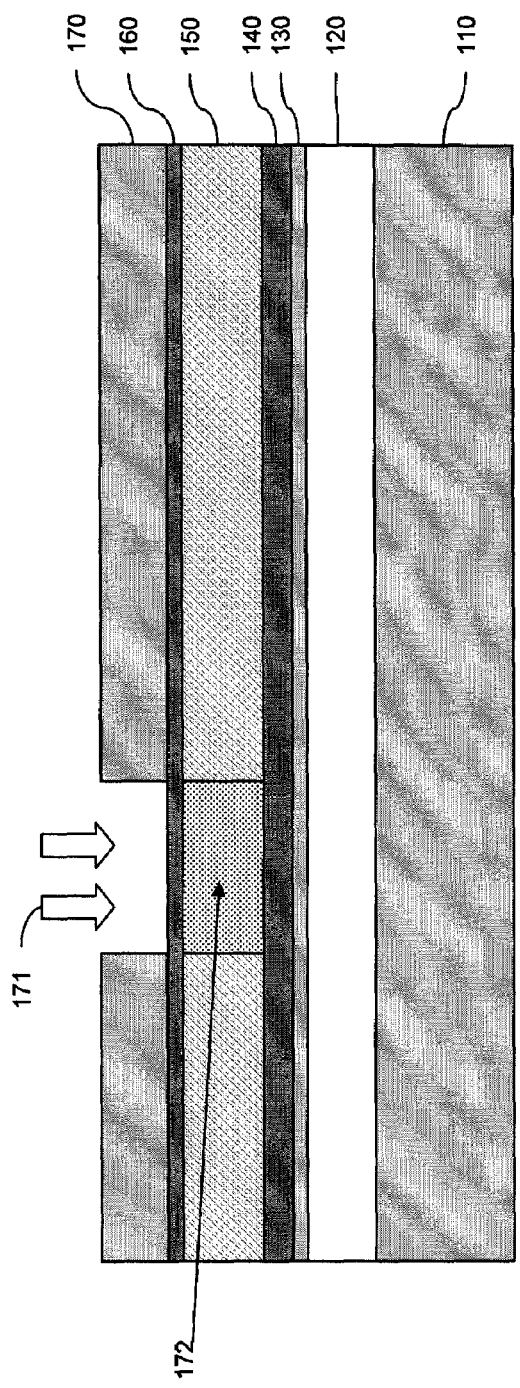
Figure 5
Figure 6

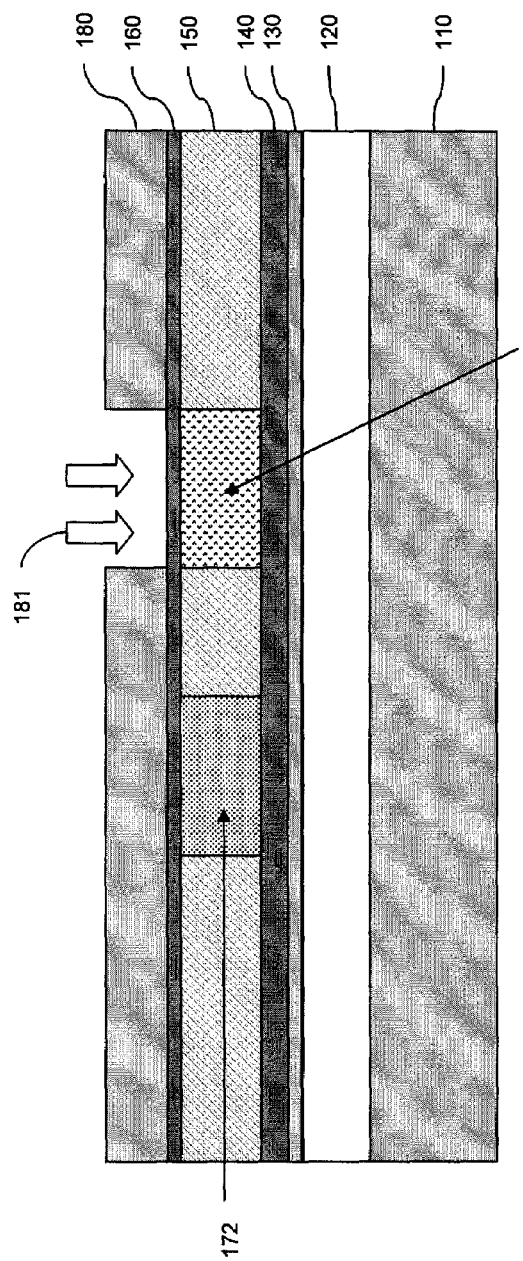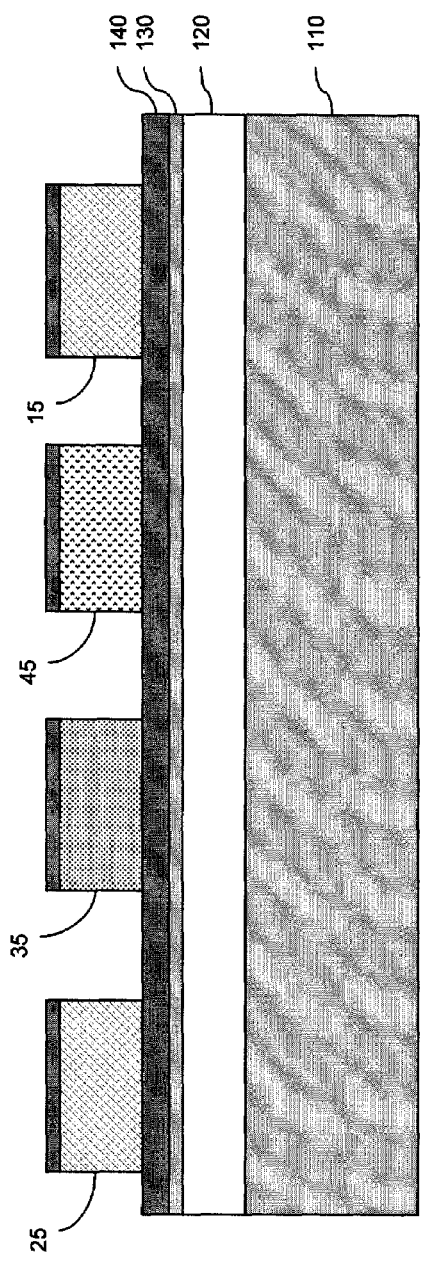

METHOD AND STRUCTURE TO PROCESS THICK AND THIN FINS AND VARIABLE FIN TO FIN SPACING

BACKGROUND OF THE INVENTION

1. Field of the Invention

The invention generally relates to integrated circuit structures, and more particularly, to an integrated circuit structure comprising multiple non-planar semiconductor bodies with different thicknesses and with variable spacing between the semiconductor bodies.

2. Description of the Related Art

Integrated circuit design decisions are often driven by device scalability and manufacturing efficiency. For example, multi-gated non-planar field effect transistors (FETs), such as double gate or tri-gate FETs, were developed to provide scaled devices with larger drive currents and reduced short channel effects over planar FETs. Double gate FETs (e.g., fin-type FETs (finFETs) are non-planar transistors in which a channel is formed in a center region of a thin semiconductor fin with source and drain regions at opposing ends. Gates are formed on the opposing sides of the thin semiconductor body adjacent the channel. The effective fin width is determined by height (e.g., short wide fins can cause partial depletion of a channel). For a double-gated fin-FET the fin thickness is generally one-fourth the length of the gate or less to ensure suppression of deleterious short-channel effects, such as variability in threshold voltage and excessive drain leakage currents. Additionally, the effective channel width of a finFET device can be increased by using multiple fins. Trigate MOSFETs have a similar structure to that of finFETs; however, the semiconductor fin width and height are approximately the same (e.g., the fin width can be approximately ½ to two times the height) so that gates can be formed on three sides of the channel, including the top surface and the opposing sidewalls. As long as the height of the channel is generally not less than the width, the channel will remain fully depleted and the three-dimensional field effects of a trigate MOSFET will give greater drive current and improved short-channel characteristics over a planar transistor. As with finFETs, the effective channel width of a trigate MOSFET can be increased by using multiple fins.

Current technology allows an integrated circuit structure to be designed and formed with multiple non-planar devices (e.g., finFETs or trigate FETs) on the same silicon-on-insulator (SOI) wafer but generally limits such structures to devices having the same fin width and to devices having approximately uniform spacing between the fins. However, there are a variety of applications that could benefit from an integrated circuit structure that has multiple fins with different thicknesses and that further has variable spacing between the fins. For example, different fin widths could be used to control depletion of different FETs in an integrated circuit or could be used in diffusion resistors. Additionally, variable fin to fin spacing could be incorporated into a fin to fin capacitor or into a precision resistor. Therefore, there is a need for a integrated circuit structure that has multiple semiconductor fins on the same substrate with different fin thicknesses and with variable spacing between the fins.

SUMMARY OF THE INVENTION

In view of the foregoing, an embodiment of the invention provides an integrated circuit structure comprising a plurality of semiconductor fins (e.g., silicon or silicon germanium fins) with different thicknesses and variable spacing on a substrate.

More particularly, an embodiment of the integrated circuit comprises a pair of first semiconductor fins and a pair of second semiconductor fins on the same substrate (e.g., an oxide layer). The second semiconductor fins are wider than the first semiconductor fins (i.e., the second semiconductor fins each have a second width that is greater than a first width of the first semiconductor fins). Additionally, the spacing between the pair of first semiconductor fins and the pair of second semiconductor fins is variable. Specifically, the spacing between the semiconductor fins is a function of the width of the fins such that the spacing between narrower fins is greater than the spacing between wider fins. Thus, the spacing between the first semiconductor fins is greater than the spacing between the wider second semiconductor fins. Due to the method of forming the pair of second semiconductor fins (described below), the spacing between the second semiconductor fins can be less than current state of the art minimum lithographic dimensions.

The integrated circuit can also comprise a pair of third semiconductor fins that are wider than the second semiconductor fins (i.e., the third semiconductor fins each have a third width that is greater than the second width of the second semiconductor fins). Thus, the spacing between the second semiconductor fins is greater than the spacing between the wider third semiconductor fins. Due to the method of forming the pair of third semiconductor fins (described below), the spacing between the third semiconductor fins can be less than current state of the art minimum lithographic dimensions.

The integrated circuit can also comprise a pair of fourth semiconductor fins that are narrower the second semiconductor fins but wider than the first semiconductor fins (i.e., the fourth semiconductor fins each have a fourth width that is less than the second width and greater than the first width). Thus, the spacing between the fourth semiconductor fins is greater than the spacing between the wider second semiconductor fins, but less than the spacing between the narrower first semiconductor fins. Due to the method of forming the pair of fourth semiconductor fins (described below), the spacing between the fourth semiconductor fins can be less than current state of the art minimum lithographic dimensions.

The semiconductor fins, formed on the same substrate and having different widths and variable spacing, can be used to in a variety of applications. Semiconductor fins with different thicknesses can be incorporated into diffusion resistors. Additionally, they may be used to control a FET (e.g., an n-FET or p-FET) to be a fully depleted or a partially depleted device. Variable fin-to-fin spacing can be incorporated into a fin-to-fin capacitor. Additionally, such variable fin-to-fin spacing can be incorporated into a precision resistor by depositing polysilicon or TaN between fins for accurate width control. Specifically, the semiconductor fins with different widths and variable spacing can be used to form a single non-planar multiple-fin field effect transistor (e.g., a single multi-fin finFET or a trigate FET). Alternatively, the semiconductor fins with different widths and spacing can be used to form multiple non-planar field effect transistors on the same substrate such that each FET comprises at least one of the semiconductor fins. For example, the plurality of semiconductor fins can be used to form various single-fin and/or multiple-fin finFETs and/or trigate FETs on the same substrate.

Embodiments of the method of fabricating an integrated circuit structure, as described above, incorporate the use of a novel sidewall image transfer process to transfer to form the semiconductor fins with different thicknesses and variable spacing on the same substrate. Specifically, embodiments of the method of fabricating the integrated circuit structure comprise providing a substrate with a semiconductor layer (e.g., a silicon-on-insulator (SOI) wafer) and forming one or more etch-stops (e.g., a pad oxide layer and a pad nitride layer) on the semiconductor layer. A polysilicon layer can be formed on the etch stop layers and an additional etch stop layer (e.g., a nitride cap layer) can be formed on the polysilicon layer.

Optionally, once the polysilcon layer is formed, an oxidation-enhancing portion (e.g., boron-doped portion) and/or an oxidation-inhibiting portion (e.g., a nitrogen-doped portion) of the polysilicon layer can be formed.

The method can further comprise forming at least two different polysilicon mandrels in the polysilicon layer. For example, a first and second mandrels (which will can be differentiated during subsequent processing) can be formed in non-doped polysilicon regions of the polysilicon layer, a third mandrel can be formed in a boron-doped portion of the polysilicon layer and/or a fourth mandrel can be formed in a nitrogen-doped portion of the polysilicon layer.

Once the mandrels are formed, an oxidation process can be performed such that pairs of oxide sidewalls are formed on some or all of the mandrels (e.g., on the second, third and fourth mandrels). Optionally, a mask can be patterned over one or more of the mandrels (e.g., the first mandrel) to prevent the formation of oxide sidewalls during the oxidation process. The resulting pairs of oxide sidewalls will vary in thickness due to the oxidation capability of the underlying polysilicon. Consequently, the spacing between pairs of oxide sidewall on each mandrel will also vary. Specifically, a pair of oxide sidewalls on a boron-doped polysilicon mandrel (e.g., the third mandrel) will be thicker and closer together than a pair of oxide sidewalls on a non-doped polysilicon mandrel (e.g., the second mandrel). Additionally, a pair of oxide sidewalls of a non-doped polysilicon mandrel will be thicker, and closer together than a pair of oxide sidewalls on a nitrogen-doped polysilicon mandrel (e.g., the fourth mandrel).

In one embodiment of the method, at this point in the process, the mandrels can be selectively removed such that the pairs of oxide sidewalls remain on the substrate. Then, images of the pairs of oxide sidewalls are transferred into a semiconductor layer of the wafer to form pairs of semiconductor fins. Note that in this embodiment, masking of polysilicon mandrels (e.g., the first mandrel) prior to the oxidation process is superfluous. Also note that in this embodiment to ensure that semiconductor fins with different thicknesses and variable fin-to-fin spacing are formed on the same substrate two or more of the following different types of polysilicon mandrels must be formed: a non-doped polysilicon mandrel (i.e., the second mandrel), a boron-doped polysilicon mandrel (i.e., the third mandrel), and/or a nitrogen-doped polysilicon mandrel (i.e., the fourth mandrel). Due to the different thicknesses of the oxide sidewalls and the varying spaces between pairs of oxide sidewalls, the semiconductor fins are formed with different widths and variable fin-to-fin spacing. Specifically, if all three of the above-mentioned types of mandrels are formed in the polysilicon layer, then three pairs of semiconductor fins with three different widths and three different fin-to-fin spacings will be formed in the silicon layer.

In another embodiment of the method, after completing the oxidation process, sidewall spacers can be simultaneously formed adjacent to the sidewalls of each mandrel. Note that in this embodiment to ensure that semiconductor fins with different thicknesses and variable fin-to-fin spacing are formed on the same substrate two or more of the following types of polysilicon mandrels must be formed: a polysilicon mandrel without oxide sidewalls (i.e., a first mandrel), a non-doped polysilicon mandrel with oxide sidewalls (i.e., a second mandrel), a boron-doped polysilicon mandrel with oxide sidewalls (i.e., a third mandrel), and/or a nitrogen-doped polysilicon mandrel with oxide sidewalls (i.e., a fourth mandrel). Thus, first sidewall spacers can be formed adjacent to the polysilicon sidewalls of the first mandrel, second sidewall spacers can are formed adjacent to the oxide sidewalls of the second mandrel, third sidewall spacers can be formed adjacent to the oxide sidewalls of the third mandrel, and/or fourth sidewall spacers can be formed adjacent to the oxide sidewalls of the fourth mandrel.

After the formation of the sidewall spacers, the mandrels can be selectively removed such that the sidewall spacers and the oxide sidewalls remain on the substrate.

Then, images of sidewall spacers without adjacent oxide sidewalls (e.g., the first sidewall spacers that were formed adjacent to the polysilicon on the first mandrel) are transferred into a semiconductor layer of the wafer to form a pair of first semiconductor fins. Simultaneously, combined images of sidewall spacers with adjacent oxide sidewalls are transferred into the semiconductor layer of the wafer to form additional pairs of semiconductor fins (e.g., the combined images of the second sidewall spacers with the adjacent oxide sidewalls that were formed on the second mandrel are transferred into the silicon layer to form the second semiconductor fin, etc.).

Due to the varying thicknesses of the oxide sidewalls (or the absence thereof) and the varying spacing between pairs of oxide sidewalls, the semiconductor fins are formed with different widths and variable fin-to-fin spacing. Thus, if all four-types of mandrels (e.g., a polysilicon mandrel without oxide sidewalls (i.e., a first mandrel), a non-doped polysilicon mandrel with oxide sidewalls (i.e., a second mandrel), a boron-doped polysilicon mandrel with oxide sidewalls (i.e., a third mandrel), and a nitrogen-doped polysilicon mandrel with oxide sidewalls (i.e., a fourth mandrel) are formed in the polysilicon layer, then four pairs of semiconductor fins with four different widths and four different fin-to-fin spacings can be formed in the silicon layer. Specifically, a pair of first fins (e.g., first fins that were formed by transferring an image of a pair of first sidewall spacers into the semiconductor layer) will have a first width that is thinner than any of the other fins and will also a fin-to-fin spacing that is greater than that of any of the other fins because of the absence of oxide sidewalls on the first mandrel. A pair of second fins (e.g., second fins that were formed by transferring a combined image of a pair of second sidewall spacers and oxide sidewalls formed on a non-doped polysilicon mandrel) will be thicker, and thus, have less fin-to-fin spacing, that the first fins. A pair of third fins (e.g., third fins that were formed by transferring a combined image of a pair of third sidewall spacers and oxide sidewalls formed on a boron-doped polysilicon mandrel) will be thicker, and thus, have less fin-to-fin spacing, that the second fins. Lastly, a pair of fourth fins (e.g., fourth fins that were formed by transferring a combined image of a pair of fourth sidewall spacers and oxide sidewalls formed on a nitrogent-doped polysilicon mandrel) will be thicker, and thus, have less fin-to-fin spacing than the first fins, but will be thinner, and thus, have greater fin-to-fin spacing than the second fins.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the invention includes all such modifications.

BRIEF DESCRIPTION OF THE DRAWINGS

The embodiments of the invention will be better understood from the following detailed description with reference to the drawings, in which:

FIG. 5 is a schematic diagram illustrating a partially completed integrated circuit structure of the invention;

FIG. 6 is a schematic diagram illustrating a partially completed integrated circuit structure of the invention;

FIG. 7 is a schematic diagram illustrating a partially completed integrated circuit structure of the invention;

FIG. 8 is a schematic diagram illustrating a partially completed integrated circuit structure of the invention;

DETAILED DESCRIPTION OF PREFERRED

Embodiments of the Invention

Figure 1:
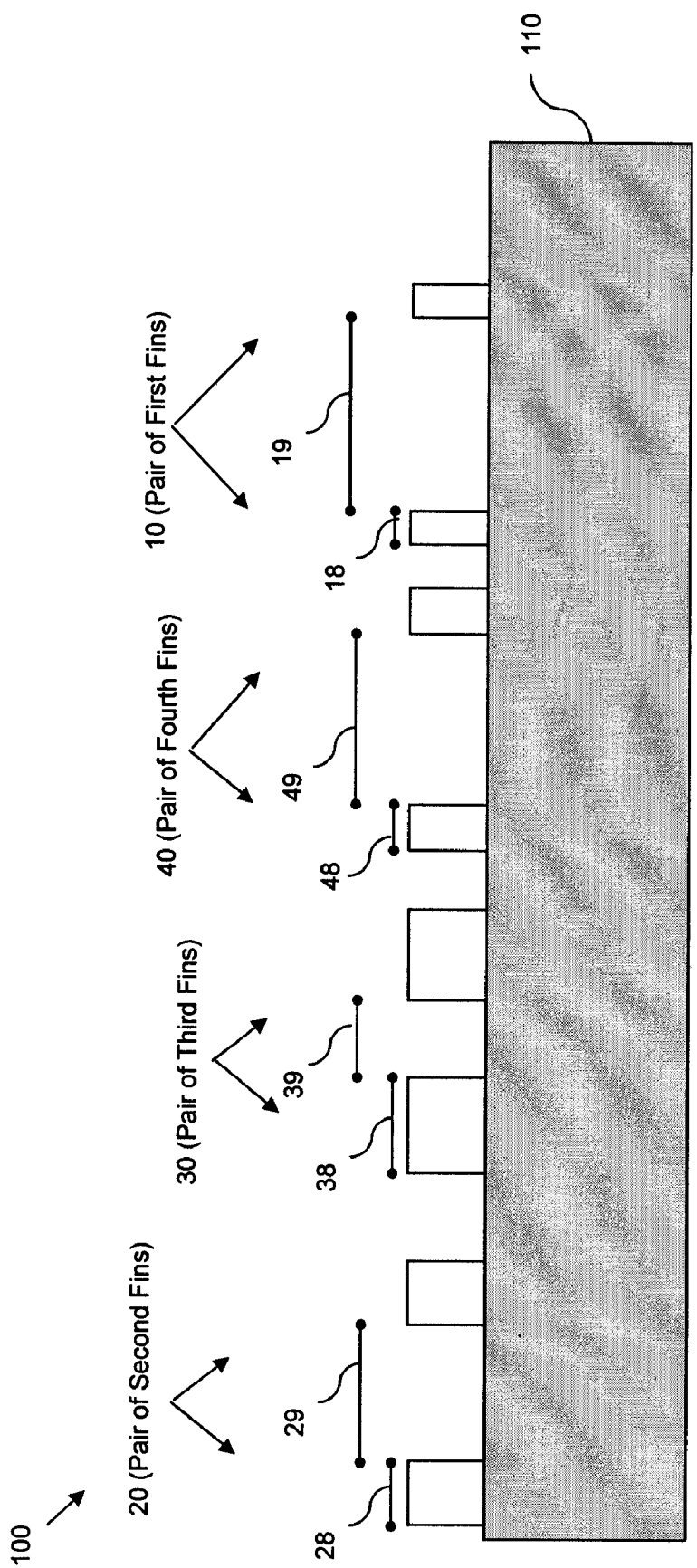
FIG. 1 is schematic diagram illustrating an embodiment of an integrated circuit structure of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the invention.

As mentioned above, current technology allows an integrated circuit structure to be designed and formed with multiple non-planar devices (e.g., finFETs or trigate FETs) on the same silicon-on-insulator (SOI) wafer but generally limits such structures to devices having the same fin width and to devices having uniform spacing between the fins. However, there are a variety of applications that could benefit from an integrated circuit structure that has multiple fins with different thicknesses and that further has variable spacing between the fins. Therefore, disclosed herein are embodiments of an integrated circuit structure that comprises a plurality of semiconductor fins (e.g., silicon or silicon germanium fins) with different thicknesses and variable fin-to-fin spacing on the same substrate. Also, disclosed herein is an associated method of forming the structure.

More particularly, referring to FIG. 1, an embodiment of the integrated circuit 100 comprises at least one (e.g., a pair) of first semiconductor fins 10 and at least one (e.g., a pair) of second semiconductor fins 20 on the same substrate 110 (e.g., an oxide layer). The second semiconductor fins 20 are wider than the first semiconductor fins 10 (i.e., the second semiconductor fins 20 each have a second width 28 that is greater than a first width 18 of the first semiconductor fins 10). Additionally, the spacing between the pair of first semiconductor fins 10 and the pair of second semiconductor fins 20 is variable. Specifically, the spacing between each pair of semiconductor fins is a function of the width of the fins such that the spacing between narrower fins is greater than the spacing between wider fins. Thus, the spacing 19 between the first semiconductor fins 10 is greater than the spacing 29 between the wider second semiconductor fins 20. Due to the various processes used to form the pair of second semiconductor fins 20 (described below), the spacing 29 between the second semiconductor fins 20 can be less than current state of the art minimum lithographic dimensions.

The integrated circuit 100 can also comprise at least one (e.g., a pair) of third semiconductor fins 30 that are wider than the second semiconductor fins 20 (i.e., the third semiconductor fins 30 each have a third width 38 that is greater than the second width 28 of the second semiconductor fins 20). Thus, the spacing 29 between the second semiconductor fins 20 is greater than the spacing 39 between the wider third semiconductor fins 30. Due to the various processes used to form the pair of third semiconductor fins 30 (described below), the spacing 39 between the third semiconductor fins 30 can be less than current state of the art minimum lithographic dimensions.

The integrated circuit 100 can also comprise a pair of fourth semiconductor fins 40 that are narrower the second semiconductor fins 20 but wider than the first semiconductor fins 10 (i.e., the fourth semiconductor fins 40 each have a fourth width 48 that is less than the second width 28 and greater than the first width 18). Thus, the spacing 49 between the fourth semiconductor fins 40 is greater than the spacing 29 between the wider second semiconductor fins 20, but less than the spacing 19 between the narrower first semiconductor fins 10. Due to the various processes used to form the pair of fourth semiconductor fins 40 (described below), the spacing 49 between the fourth semiconductor fins 40 can be less than current state of the art minimum lithographic dimensions.

Figure 2:
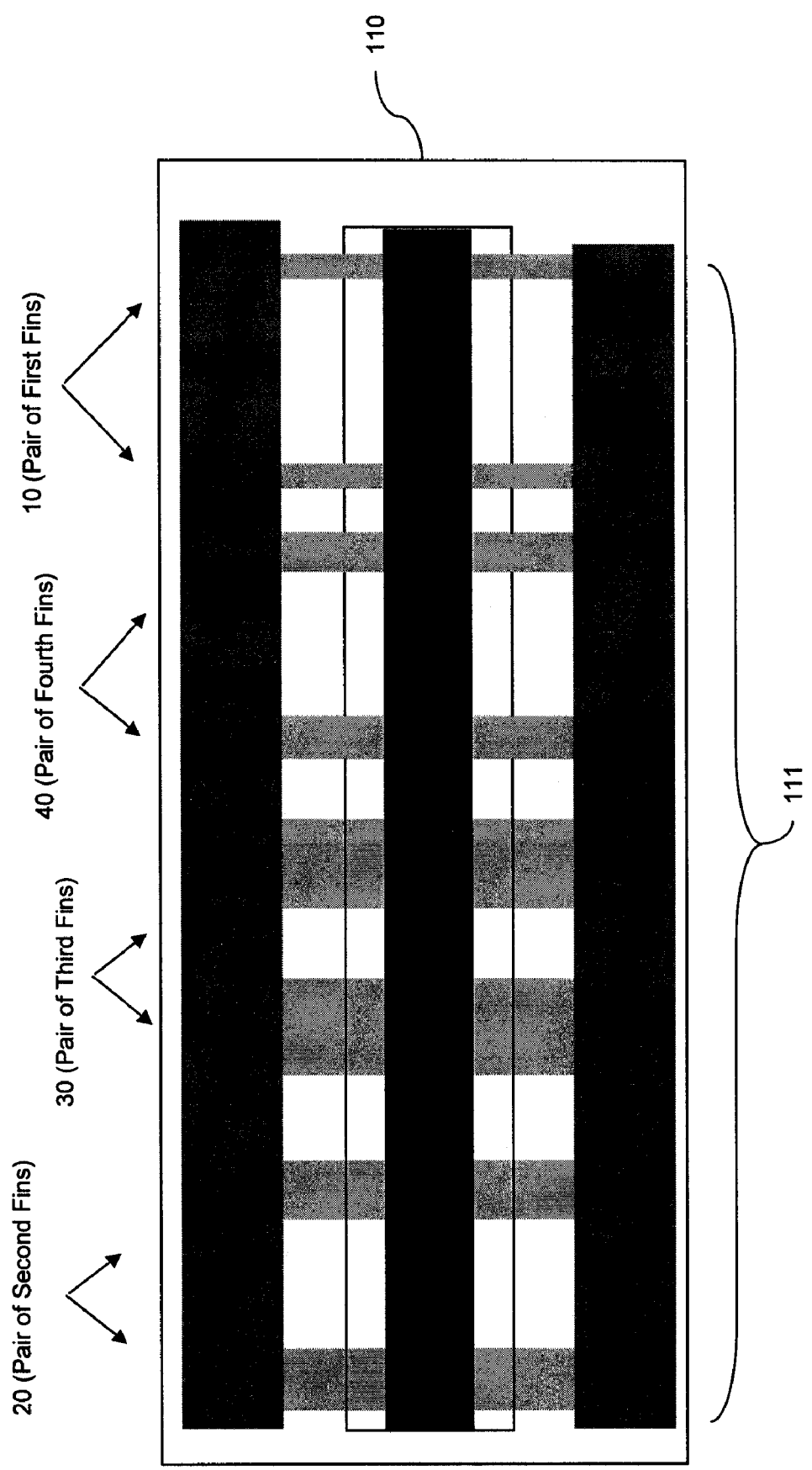
FIGS. 2-3 are schematic diagrams illustrating exemplary implementations of the integrated circuit structure of the invention.
Figure 3:
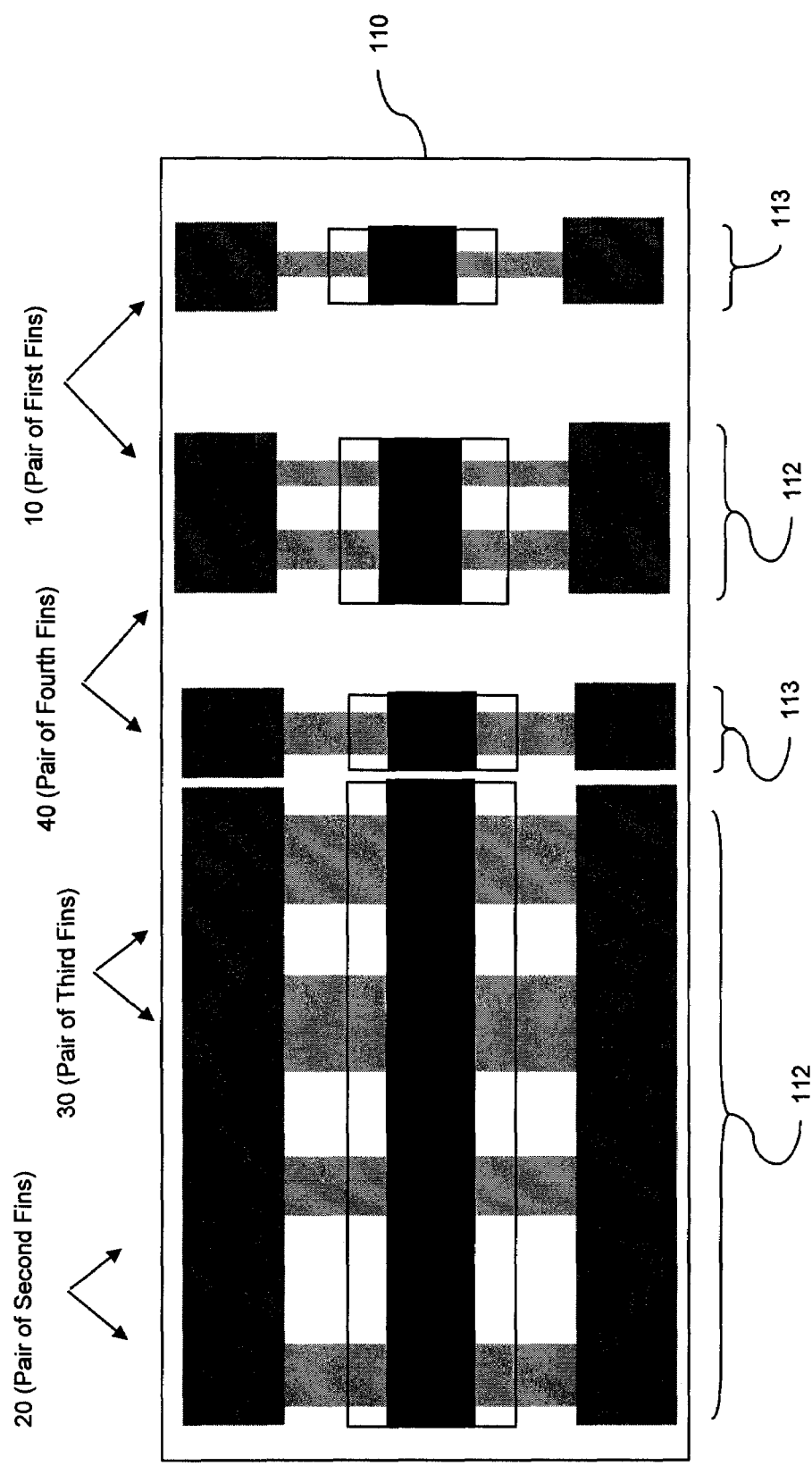

The semiconductor fins (e.g., fins 10, 20, 30 and/or 40), formed on the same substrate and having different widths and variable spacing, can be used to in a variety of applications. Semiconductor fins with different thicknesses can be incorporated into diffusion resistors. Additionally, they may be used to control FET depletion. For example, fin width in an n-FET or p-FET can be used to establish a fully depleted or a partially depleted device. Variable fin-to-fin spacing can be incorporated into a fin-to-fin capacitor. Additionally, such variable fin-to-fin spacing can be incorporated into a precision resistor by depositing polysilicon or TaN between fins for accurate width control. Specifically, referring to FIG. 2, the semiconductor fins 10-40 with different widths and variable spacing can be used to form a single non-planar multiple-fin field effect transistor 111 (e.g., a single multi-fin finFET or a trigate FET). Alternatively, referring to FIG. 3, the semiconductor fins 10-40 with different widths and spacing can be used to form multiple non-planar field effect transistors 112-113 on the same substrate such that each FET comprises at least one of the semiconductor fins. For example, the plurality of semiconductor fins 10-40 can be used to form various single-fin 113 and/or multiple-fin 112 finFETs and/or trigate FETs on the same substrate 110.

Figure 4:
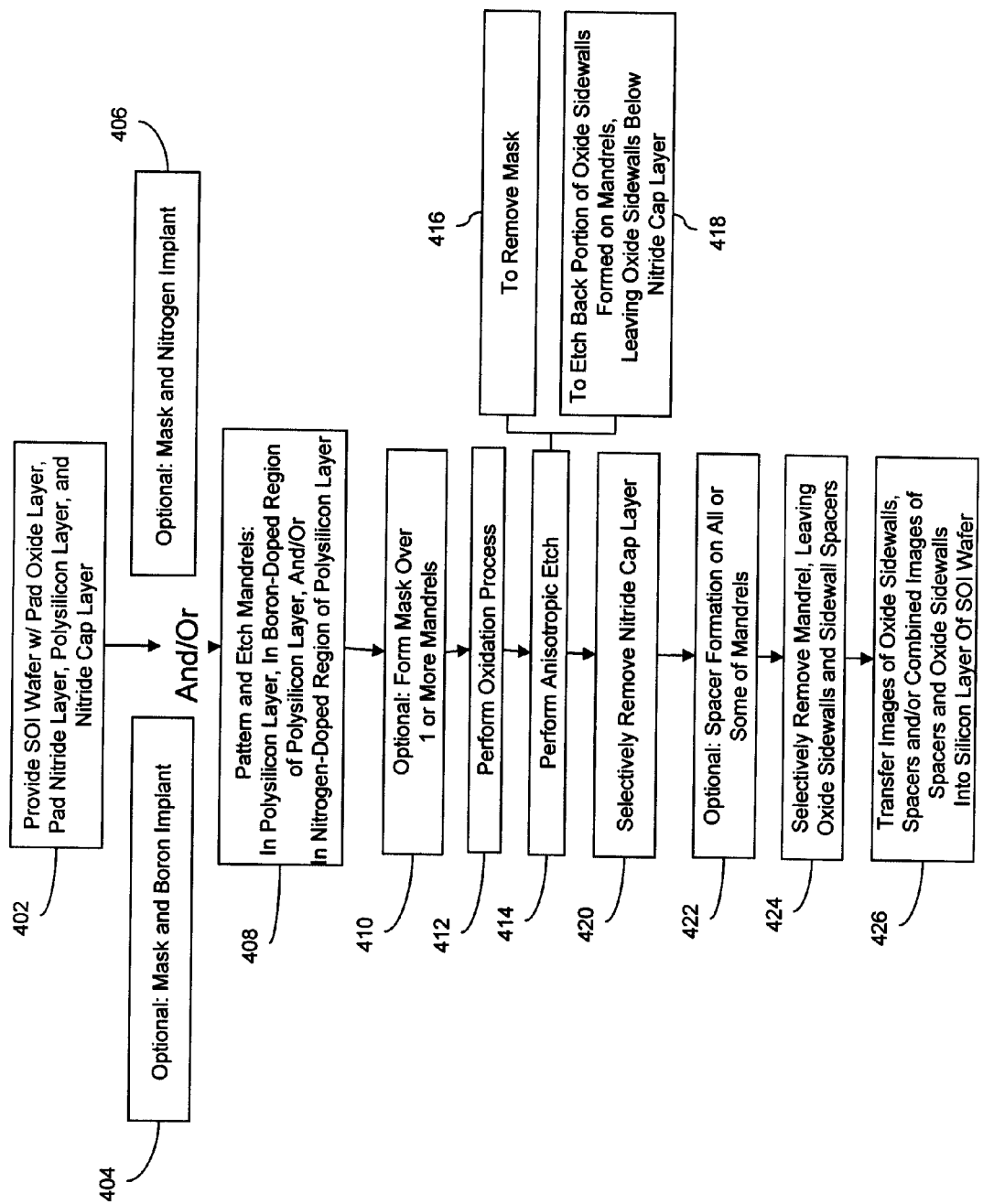
FIG. 4 is a schematic flow diagram illustrating an embodiment of a method of the forming the integrated circuit structure of the invention.

Referring to FIG. 4, embodiments of the method of fabricating an integrated circuit structure, as described above, incorporate the use of a novel sidewall image transfer process to transfer to form the semiconductor fins with different thicknesses and variable spacing on the same substrate. Specifically, embodiments of the method of fabricating the integrated circuit structure of the invention comprise providing a wafer 105 with a semiconductor layer 120 (e.g., a silicon layer, a silicon germanium layer, etc.) on an insulator layer 110 (e.g., a silicon-on-insulator (SOI) wafer) and forming one or more etch-stop layers (e.g., a pad oxide layer 130 and a pad nitride layer 140) on the semiconductor layer 120. A polysilicon layer 150 can be formed on the etch stop layers and an additional etch stop layer (e.g., a nitride cap layer 160) can be formed on the polysilicon layer 150. To facilitate subsequent processing steps, the nitride cap layer 160 should be formed thinner than the pad nitride layer 140 (402; see FIG. 5).

Optionally, once the polysilcon layer 150 is formed (at process 402), an oxidation-enhancing portion and/or an oxidation-inhibiting portion of the polysilicon layer can be formed (404-406). An oxidation-enhancing portion 172 of the polysilicon layer 150 can be formed by patterning a mask 170 above the polysilicon layer 150 and implanting an unprotected area of the polysilicon layer 150 with a material 171 that increases the oxidation rate of polysilicon (e.g., boron, $B_{11}$) (see FIG. 6). Similarly, an oxidation-inhibiting portion 182 of the polysilicon layer 150 can be formed by patterning a mask 180 above the polysilicon layer 150 and implanting an unprotected area of the polysilicon layer 150 with a material 181 that decreases the oxidation rate of polysilicon (e.g., nitrogen, $N_2$) (see FIG. 7). Implant concentrations can be controlled to effect the oxidation-enhancing or oxidation-inhibiting capabilities of the polysilicon.

The method can further comprise forming polysilicon mandrels in the polysilicon layer, for example, by lithographic patterning (408; see FIG. 8). For example, a first mandrel 15 and a second mandrel 25 can be formed in non-doped polysilicon regions of the polysilicon layer 150. Additionally, a third mandrel 35 and/or a fourth mandrel 45 can be formed in a boron-doped area 172 and a nitrogen-doped area 182, respectively, of the polysilicon layer. At least two different mandrels must be formed in order to form semiconductor fins with different widths and variable fin-to-fin spacing (see detailed discussion below). Each mandrel can be patterned and etched to current state of the art minimum lithographic dimensions.

Figure 9:
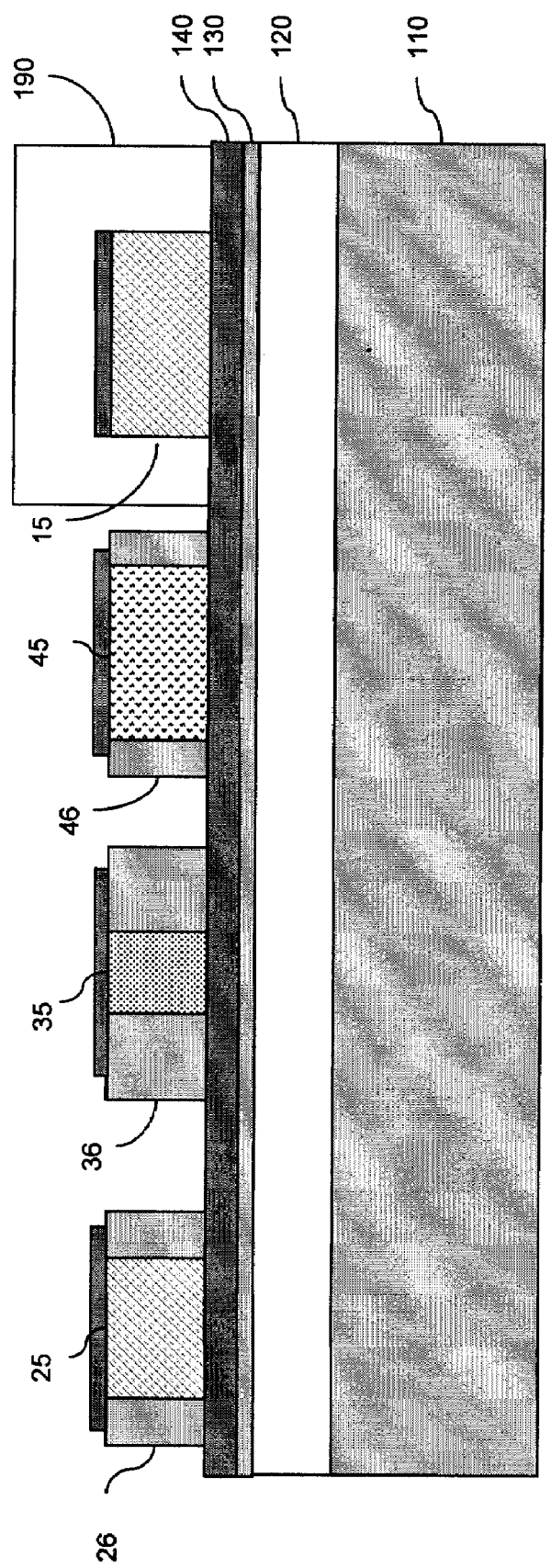
FIG. 9 is a schematic diagram illustrating a partially completed integrated circuit structure of the invention.

Once the mandrels (e.g., mandrels 15, 25, 35 and/or 45) are formed (at process 408) an oxidation process can be performed such that pairs of oxide sidewalls are formed on some or all of the mandrels (e.g., sidewalls 26 on the second mandrel 25, sidewalls 36 on the third mandrel 35 and sidewalls 46 on the fourth 45 mandrels) (212; see FIG. 9). Optionally, a mask 190 (e.g., an oxide mask) can be patterned over one or more of the mandrels (e.g., the first mandrel 15) to prevent the formation of oxide sidewalls during the oxidation process (210). Preventing the oxidation of the sidewalls on the first mandrel 15 differentiates the first mandrel 15 from the second mandrel 25 so that fins 10 and 20 (see FIG. 1) with different widths and variable fin-to-fin spacing can be formed on the same substrate without requiring the use of boron or nitrogen-doping of the polysilicon layer 150 (see detailed discussion below). Ultimately fin-to-fin spacing and fin thickness can be controlled depending up the polysilicon oxidation time.

Figure 10:
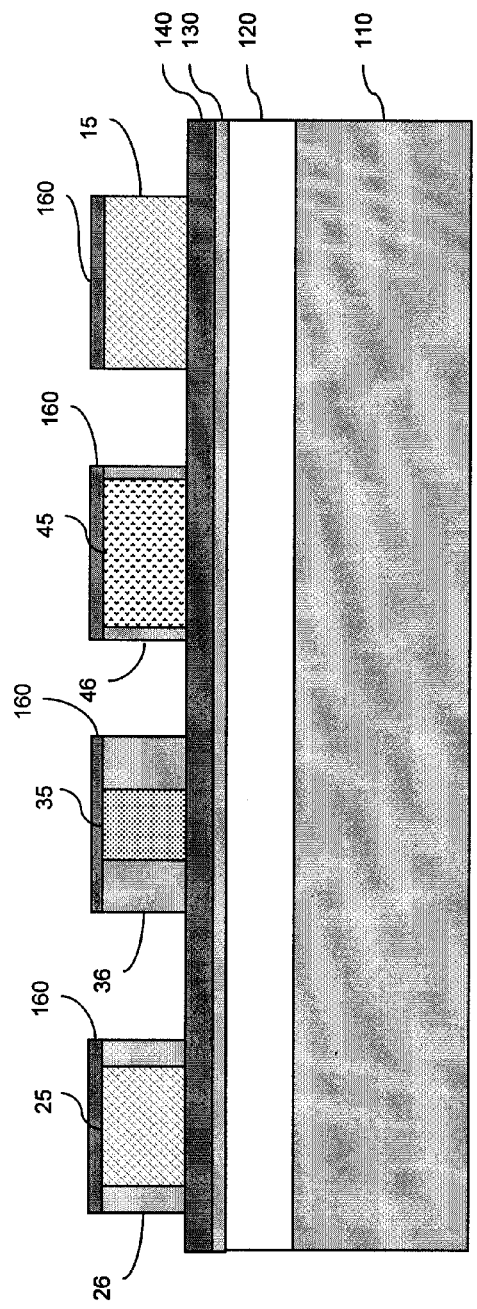
FIG. 10 is a schematic diagram illustrating a partially completed integrated circuit structure of the invention.
Figure 11:
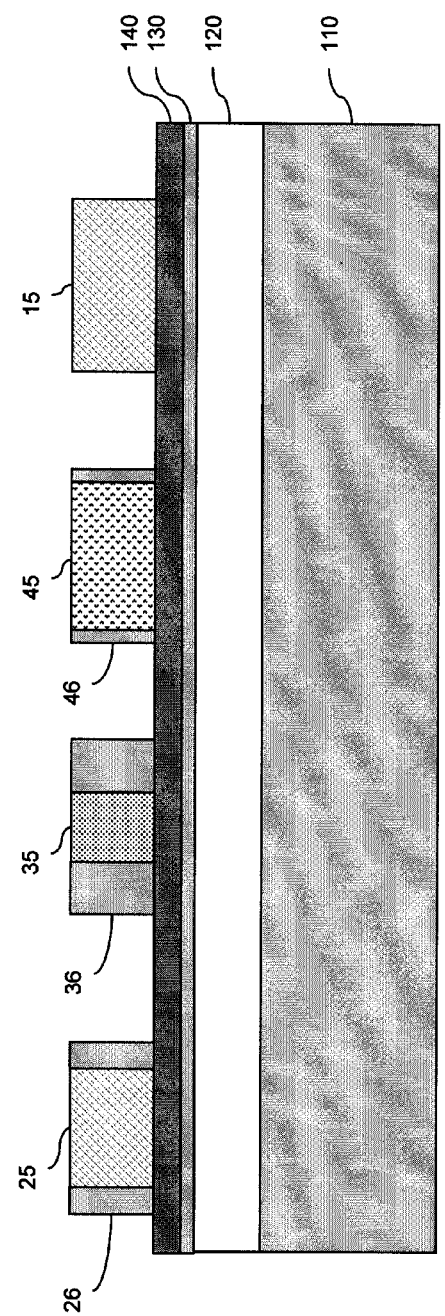
FIG. 11 is a schematic diagram illustrating a partially completed integrated circuit structure of the invention.

After the oxidation process 212 is completed, an anisotropic etch process can be performed to selectively remove oxide masks and to etch back oxide extending outward below the nitride cap layer 160 on each of the mandrels (e.g., the second 25, third 35 and/or fourth 45 mandrels) (214-218; see FIG. 10). The nitride cap 160 can also be removed (220; see FIG. 11). Removal of the nitride cap layer 160 can be accomplished, for example, using a selective etching process. The process should be performed such that a portion of the thicker pad nitride layer 140 remains. The resulting pairs of oxide sidewalls 26, 36, and 46 will vary in thickness due to oxidation capability of the underlying polysilicon. Thus, the spacing between pairs of oxide sidewalls on each mandrel 25, 35, and 45 will also vary. Specifically, a pair of oxide sidewalls 36 on a boron-doped polysilicon mandrel 35 (e.g., the third mandrel) will be thicker and, thus, closer together, than a pair of oxide sidewalls 26 on a non-doped polysilicon mandrel 25 (e.g., the second mandrel). Additionally, a pair of oxide sidewalls 26 of a non-doped polysilicon mandrel 25 will be thicker, and thus, closer together, than a pair of oxide sidewalls 46 on a nitrogen-doped polysilicon mandrel 45 (e.g., the fourth mandrel).

Figure 12:
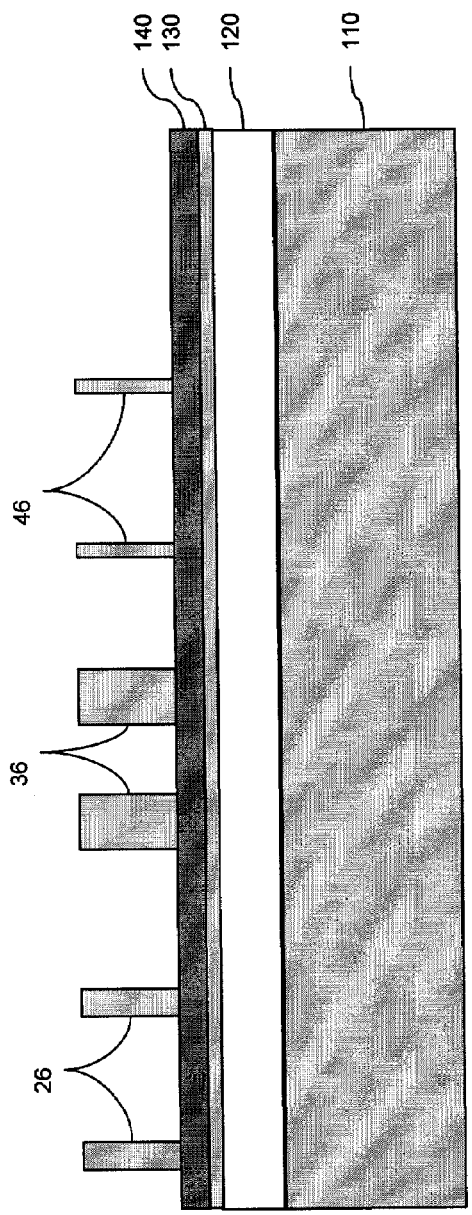
FIG. 12 is a schematic diagram illustrating a partially completed integrated circuit structure of the invention.
Figure 13:
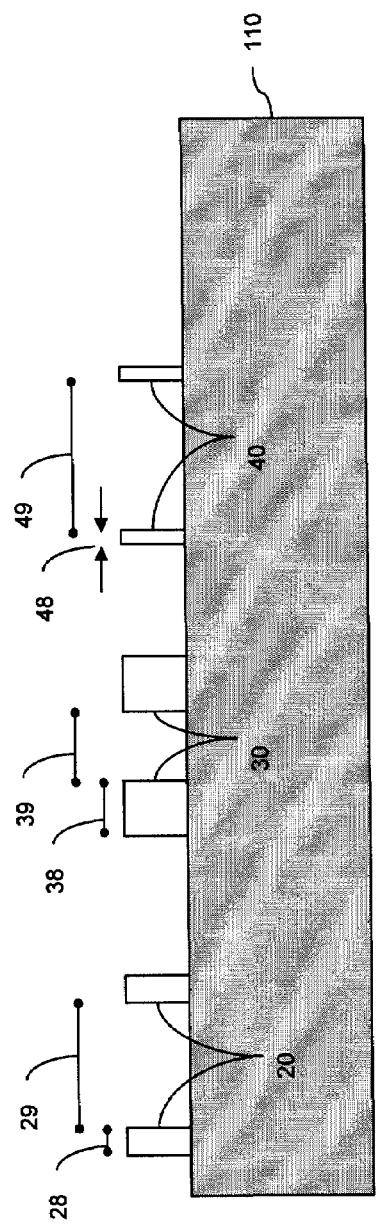
FIG. 13 is a schematic diagram illustrating a partially completed integrated circuit structure of the invention.

In one embodiment of the method, at this point in the process, the mandrels can be selectively removed such that the pairs of oxide sidewalls 26, 36, and 46 remain on the substrate (222; see FIG. 12). Then, images of the pairs of oxide sidewalls are transferred into a semiconductor layer 120 of the wafer 105 to form pairs of semiconductor fins with different thicknesses and variable fin-to-fin spacing (226; see FIG. 13). Note that in this embodiment, masking of polysilicon mandrels (e.g., the first mandrel 10 of FIG. 9) prior to the oxidation process is superfluous because the mandrel is removed and only the oxide sidewalls are used to form the semiconductor fins. Also note that in this embodiment to ensure that semiconductor fins with different thicknesses and variable fin-to-fin spacing are formed on the same substrate 110 at least two different mandrels of the following types must be formed: a non-doped polysilicon mandrel with oxide sidewalls (i.e., the second mandrel 25), a boron-doped polysilicon mandrel with oxide sidewalls (i.e., the third mandrel 35), and/or a nitrogen-doped polysilicon mandrel with oxide sidewalls (i.e., the fourth mandrel 45). Thus, after the oxidation process, a pair of oxide sidewalls 26 from a second mandrel 25, a pair of oxide sidewalls 36 from a third mandrel 35, and/or a pair of oxide sidewalls 46 from a fourth mandrel 45 can be simultaneously transferred into the semiconductor layer to form pairs of second 20, third 30 and/or fourth 40 semiconductor fins, respectively.

Due to the different thicknesses of the oxide sidewalls 26, 36, and 46 and the varying spaces between pairs of oxide sidewalls, the semiconductor fins 20, 30, and 40 are formed with different widths and variable fin-to-fin spacing. Specifically, if all three-types of mandrels (i.e., a non-doped polysilicon mandrel with oxide sidewalls 25, a boron-doped polysilicon mandrel with oxide sidewalls 35, and a nitrogen-doped polysilicon mandrel with oxide sidewalls 45) are formed in the polysilicon layer, then three pairs of semiconductor fins 20, 30, and 40 with three different widths and three different fin-to-fin spacings can be formed in the silicon layer. Specifically, a pair of third fins will be formed thicker and closer together than a pair of second fins and the pair of second fins will be formed thicker and closer together than a pair of fourth fins.

Figure 14:
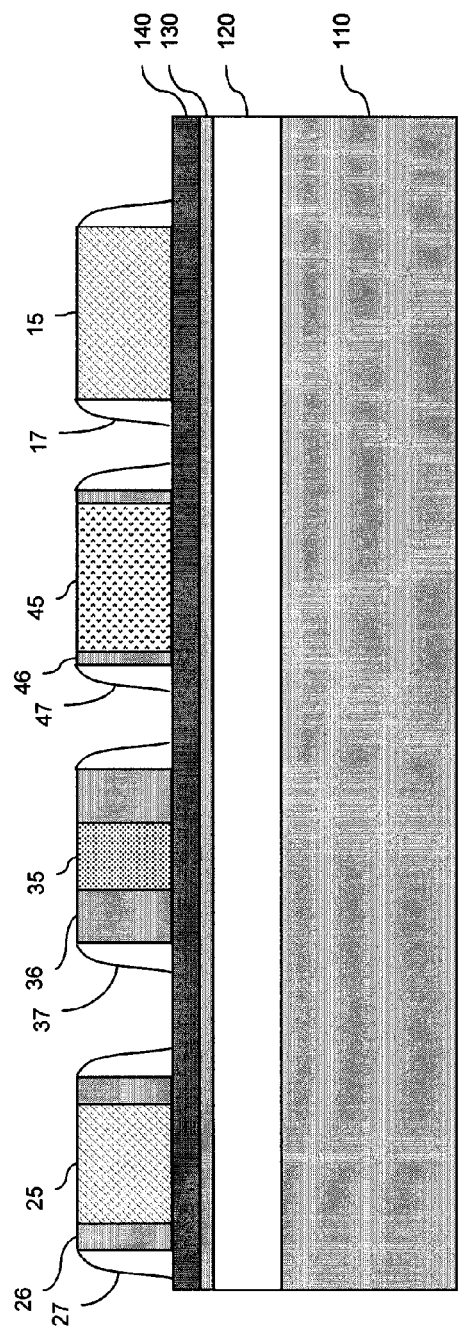
FIG. 14 is a schematic diagram illustrating an integrated circuit structure of the invention.

In another embodiment of the method, after completing the oxidation process (at process 412) and removing the nitride cap layer (at process 420), sidewall spacers can be simultaneously formed adjacent to the sidewalls of each mandrel (422; see FIG. 14). Note that in this embodiment to ensure that semiconductor fins with different thicknesses and variable fin-to-fin spacing are formed on the same substrate at least two different types of polysilicon mandrels must be formed (e.g., at least two of a polysilicon mandrel without oxide sidewalls (i.e., a first mandrel 15), a non-doped polysilicon mandrel with oxide sidewalls (i.e., a second mandrel 25), a boron-doped polysilicon mandrel with oxide sidewalls (i.e., a third mandrel 35), and/or a nitrogen-doped polysilicon mandrel with oxide sidewalls (i.e., a fourth mandrel 45). Thus, first sidewall spacers 17 can be formed adjacent to the polysilicon sidewalls of the first mandrel 15, second sidewall spacers 27 can are formed adjacent to the oxide sidewalls 26 of the second mandrel 25, third sidewall spacers 37 can be formed adjacent to the oxide sidewalls 36 of the third mandrel 35, and/or fourth sidewall spacers 47 can be formed adjacent to the oxide sidewalls 46 of the fourth mandrel 45.

Figure 15:
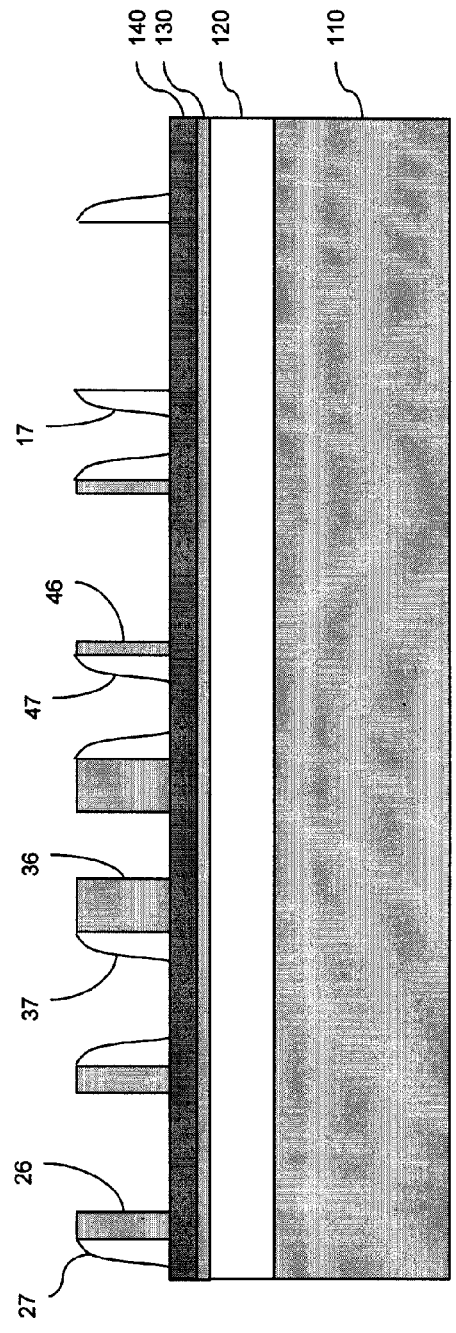
FIG. 15 is a schematic diagram illustrating a partially completed integrated circuit structure of the invention..

After the formation of the sidewall spacers (at process 422), the mandrels (e.g., mandrels 10-40) can be selectively removed such that the sidewall spacers (17-47) and the oxide sidewalls (26-46) remain on the substrate (424; see FIG. 15). Then, images of sidewall spacers 17 without adjacent oxide sidewalls (e.g., the first sidewall spacers 17 that were formed adjacent to the polysilicon on the first mandrel 15) are transferred into a semiconductor layer 120 of the wafer 105 to form a pair of first semiconductor fins 10.

Simultaneously, combined images of sidewall spacers with adjacent oxide sidewalls are transferred into the semiconductor layer 120 of the wafer to form additional pairs of semiconductor fins (e.g., the combined images of the second sidewall spacers 27 with the adjacent oxide sidewalls 26 that were formed on the second mandrel 20 are transferred into the silicon layer 120 to form the second semiconductor fins 20, the combined images of the third sidewall spacers 37 with the adjacent oxide sidewalls 36 that were formed on the third mandrel 30 are transferred into the silicon layer 120 to form the third semiconductor fins 30, etc.).

Due to the varying thicknesses of the oxide sidewalls 26-46 (or the absence thereof) and the varying spacing between pairs of oxide sidewalls, the semiconductor fins are formed with different widths and variable fin-to-fin spacing. Thus, if all four-types of mandrels (e.g., a polysilicon mandrel without oxide sidewalls (i.e., a first mandrel), a non-doped polysilicon mandrel with oxide sidewalls (i.e., a second mandrel), a boron-doped polysilicon mandrel with oxide sidewalls (i.e., a third mandrel), and a nitrogen-doped polysilicon mandrel with oxide sidewalls (i.e., a fourth mandrel) are formed in the polysilicon layer, then four pairs of semiconductor fins with four different widths and four different fin-to-fin spacings can be formed in the silicon layer. Specifically, referring to FIG. 1, a pair of first fins 10 (e.g., first fins that were formed by transferring an image of a pair of first sidewall spacers into the semiconductor layer) will have a first width 18 that is thinner than any of the other fins and will also a fin-to-fin spacing 19 that is greater than that of any of the other fins because of the absence of oxide sidewalls on the first mandrel 15. A pair of second fins 20 (e.g., second fins that were formed by transferring a combined image of a pair of second sidewall spacers and oxide sidewalls formed on a non-doped polysilicon mandrel) will be thicker, and thus, have less fin-to-fin spacing, that the first fins 10. A pair of third fins 30 (e.g., third fins that were formed by transferring a combined image of a pair of third sidewall spacers and oxide sidewalls formed on a boron-doped polysilicon mandrel) will be thicker, and thus, have less fin-to-fin spacing, that the second fins 20. Lastly, a pair of fourth fins 40 (e.g., fourth fins that were formed by transferring a combined image of a pair of fourth sidewall spacers and oxide sidewalls formed on a nitrogent-doped polysilicon mandrel) will be thicker, and thus, have less fin-to-fin spacing than the first fins 10, but will be thinner, and thus, have greater fin-to-fin spacing than the second fins 20.

Therefore, disclosed above, is an integrated circuit structure with a plurality of semiconductor fins with different widths and variable spacing on the same substrate. Also, disclosed is a method for forming this integrated circuit structure that incorporates a sidewall image transfer process using different types of mandrels (e.g., a non-doped polysilicon mandrel without oxide sidewalls, a non-doped polysilicon mandrel with oxide sidewalls, a boron-doped polysilicon mandrel with oxide sidewalls, and/or a nitrogen-doped polysilicon mandrel with oxide sidewalls). Fin thickness and fin-to-fin spacing can be controlled by the oxidation process used to form oxide sidewalls on the mandrels, and more particularly, by the oxidation processing time and the use of intrinsic, oxidation-enhancing and/or oxidation-inhibiting polysilicon mandrels. The fin thickness can further by controlled by the use of sidewalls spacers combined with or instead of the oxide sidewalls. Specifically, images of the oxide sidewalls alone, images of sidewall spacers alone, and/or combined images of sidewall spacers and oxide sidewalls can be transferred into a semiconductor layer to form the fins. The semiconductor fins with different thicknesses and variable spacing can be used to form a single multiple-fin FET or, alternatively, the semiconductor fins can be used to form various single-fin and/or multiple-fin FETs.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that the invention can be practiced with modification within the spirit and scope of the appended claims.

What is claimed is:

1. An integrated circuit structure comprising:
   a substrate;
   a plurality of semiconductor fins on said substrate comprising first semiconductor fins having a first width and second semiconductor fins having a second width, wherein said second width is greater than said first width and wherein spacing between said semiconductor fins is variable; and
   one of a non-planar field effect transistor comprising said plurality of said semiconductor fins and a plurality of non-planar field effect transistors each comprising at least one of said semiconductor fins, wherein said plurality of semiconductor fins further comprises at least one adjacent pair of said first semiconductor fins and at least one adjacent pair of said second semiconductor fins, wherein said spacing between said adjacent pair of said first semiconductor fins is greater than said spacing between said adjacent pair of said second semiconductor fins.

2. The integrated circuit structure of claim 1, wherein said plurality of semiconductor fins further comprises a third semiconductor fin having a third width that is greater than said second width.

3. The integrated circuit structure of claim 1, wherein said plurality of semiconductor fins further comprises a fourth semiconductor fin having a fourth width that is less than said second width and greater than said first width.

4. The integrated circuit structure of claim 1, wherein said semiconductor fins comprise one of silicon and silicon germanium and said substrate comprises an oxide layer.

5. An integrated circuit structure comprising:
   a substrate;
   a plurality of semiconductor fins on said substrate comprising first semiconductor fins having a first width and second semiconductor fins having a second width, wherein said second width is greater than said first width and wherein spacing between said semiconductor fins is variable; and
   one of a non-planar field effect transistor comprising said plurality of said semiconductor fins and a plurality of non-planar field effect transistors each comprising at least one of said semiconductor fins,
   wherein said plurality of semiconductor fins further comprises at least one adjacent pair of said first semiconductor fins and at least one adjacent pair of said second semiconductor fins, wherein said spacing between said adjacent pair of said first semiconductor fins is greater than said spacing between said adjacent pair of said second semiconductor fins and wherein said spacing between said adjacent pair of said second semiconductor fins is less than current state of the art minimum lithographic dimensions.

6. The integrated circuit structure of claim 5, wherein said plurality of semiconductor fins further comprises a third semiconductor fin having a third width that is greater than said second width.

7. The integrated circuit structure of claim 5, wherein said plurality of semiconductor fins further comprises a fourth semiconductor fin having a fourth width that is less than said second width and greater than said first width.

8. The integrated circuit structure of claim 5, wherein said semiconductor fins comprise one of silicon and silicon germanium and said substrate comprises an oxide layer.

* * * * *